United States Patent
Stiff et al.

(10) Patent No.: US 7,196,586 B1
(45) Date of Patent: Mar. 27, 2007

(54) OSCILLATOR AMPLIFIER CIRCUIT OPERABLE TO PROVIDE SYMMETRIC CURRENT LIMITING AND METHOD OF SAME

(75) Inventors: Jonathon Stiff, Beaverton, OR (US); Aaron Brennan, Moscow, ID (US)

(73) Assignee: Cypress Semiconductor Corporation, San Jose, CA (US)

( * ) Notice: Subject to any disclaimer, the term of this patent is extended or adjusted under 35 U.S.C. 154(b) by 49 days.

(21) Appl. No.: 11/009,816

(22) Filed: Dec. 10, 2004

Related U.S. Application Data

(60) Provisional application No. 60/532,115, filed on Dec. 22, 2003.

(51) Int. Cl.
*H03F 3/04* (2006.01)

(52) U.S. Cl. .................................. 330/311; 330/298
(58) Field of Classification Search ................. 330/298
See application file for complete search history.

(56) References Cited

U.S. PATENT DOCUMENTS

| | | | | |
|---|---|---|---|---|
| 3,461,399 A | * | 8/1969 | Houpis et al. .................. 331/62 |
| 4,208,639 A | * | 6/1980 | Stickel ................. 331/116 FE |
| 4,871,982 A | * | 10/1989 | Williams et al. .............. 331/75 |
| 5,021,747 A | * | 6/1991 | Isham et al. ................. 330/284 |
| 5,914,643 A | * | 6/1999 | Tinsley et al. ......... 331/116 FE |
| 6,144,173 A | * | 11/2000 | Nerone ........................ 315/291 |
| 6,893,101 B2 | * | 5/2005 | Marra et al. ................. 330/296 |
| 2004/0164647 A1 | * | 8/2004 | Micko ......................... 310/319 |

OTHER PUBLICATIONS

Vittoz et al., "High-Performance Crystal Oscillator Circuits: Theory and Application"; IEEE Journal of Solid-Sate Circuits; vol. 23, No. 3; Jun. 1988.
Bianchi et al.; "Analoggalc Crystal Oscillators for High-Temperature Applications"; IEEE Transactions on Solid-Sate Circuits; vol. 35, No. 1; Jan. 2000.
Vittoz et al.; Low-Power, High-Precision Crystal Oscillators; CentreSuisse d'Electronique et de Microtechnique SA Jaquet-Droz, CH 2007 Neuchatel, Switzerland; 2001.

* cited by examiner

*Primary Examiner*—Robert Pascal
*Assistant Examiner*—Krista. Flanagan

(57) ABSTRACT

An amplifier circuit operable to provide symmetric current limiting. The amplifier circuit includes a common source amplifier for sourcing a current and receiving an voltage input, a current source, and a current limiting device coupled between the common source amplifier and the current source. The current limiting device is operable to limit the current sourced by the common source amplifier. A bias network coupled to the current limiting device biases the current limiting device. An output is coupled to the current limiting device. The amount of current that is sourced to the output of the amplifier circuit may be limited, such that current limiting is symmetrical.

24 Claims, 7 Drawing Sheets

OSCILLATOR AMPLIFIER CIRCUIT OPERABLE TO PROVIDE SYMMETRIC CURRENT LIMITING AND METHOD OF SAME

CROSS-REFERENCE TO RELATED APPLICATION

This application claims priority from co-pending U.S. Provisional Patent Application No. 60/532,115, filed on Dec. 22, 2003, entitled "OSCILLATOR AMPLIFIER WITH SYMMETRIC CURRENT LIMITING," by Stiff et al., and assigned to the assignee of the present application, which is herein incorporated by reference.

FIELD OF INVENTION

The present invention relates generally to the field of electronic circuits. Specifically, embodiments of the present invention relates to oscillator circuits.

BACKGROUND OF THE INVENTION

A Pierce oscillator is the common term for an oscillator where the transistor amplifier common node is the source for a Metal Oxide Semiconductor Field Effect Transistor (MOSFET) or emitter for a bipolar junction transistor (BJT). In a more general sense, a Pierce oscillator is an oscillator where a transconductance amplifier (high input impedance, high output impedance) serves as the regenerative amplifier with an LC (inductor-capacitor) or crystal resonator in the feedback path.

FIG. 1 is a circuit diagram of a conventional Pierce oscillator amplifier circuit 100, in accordance with the prior art. Pierce oscillator amplifier circuit 100 includes a common source amplifier (M1) 110 with a current mirror load (M2) 120. The common source amplifier 110 can operate in either weak or strong inversion. An external amplitude control loop can be used to adjust the current into the amplifier bias (AmpBias) node 130 to control the transconductance (gm) of M1 110, which will control the amplitude of oscillation. The feedback resistor 140 is used to bias common source amplifier 110.

The conventional circuit of FIG. 1 requires optimization to minimize distortion when used with a specific crystal resonator and load capacitance. If the circuit is required to work over a large range of resonator and load capacitance values, the amplifier must be capable of providing a wide range of transconductance. This requirement can result in amplifiers with a linear operating range that is less than the amplitude of oscillation. Under this condition, the amplifier operates more as a switch and less as a linear gain element.

Under this condition, the current the amplifier can source and sink is not symmetric. The amplifier will achieve the maximum sink current when the voltage at $X_{in}$ ($VX_{in}$) is close enough to the positive voltage supply to turn off M1 110. Thus the amplifier output sink current ($I_{sink}$) is determined by the amplifier bias current ($I_{amp}$) and the mirror ratio between M4 150 and M2 120, and is shown in Equation 1.

$$I_{sink_{MAX}} = -\frac{(W/L)_{M2}}{(W/L)_{M4}} I_{amp} \quad (1)$$

The amplifier will achieve its maximum source current when the voltage at $X_{in}$ reaches its minimum value. The current through M1 110 minus the current through M2 120 is the total current the amplifier can source. Assuming M1 110 remains in saturation, the maximum current the amplifier can source (neglecting output resistance and second order effects) is shown in Equation 2.

$$I_{source_{MAX}} = \frac{1}{2}\mu_n C_{ox}\left(\frac{W}{L}\right)_{M1}((V_{DD} - V_{Xin}) - V_{THP})^2 - \frac{(W/L)_{M2}}{(W/L)_{M4}} I_{amp} \quad (2)$$

where $V_{DD}$ is the positive supply voltage. In order to achieve large gm values for use with large load capacitance values, large crystal resonator motional resistances and minimize the bias current, $(W/L)_{M1}$ is usually a relatively large number.

FIG. 2A is graphical diagram of an exemplary waveform 200 from a conventional Pierce oscillator amplifier circuit with asymmetrical output current, in accordance with the prior art. FIG. 2A shows a Positive Metal Oxide Semiconductor (PMOS) amplifier with asymmetrical output current 210. The amount of current that M1 100 can source is much larger than the current M2 120 can sink for a sinusoid input at $X_{in}$ centered about $V_{THP}$ of M1 110. At steady state, the amplifier must sink as much current as it sources. This means that M1 110 will be on just long enough to balance the current that flows through M2 120 while M1 110 is off. If M1 110 is on for a fraction of the cycle, the maximum excursion at $X_{in}$ and $X_{out}$ below the voltage at which M1 110 turns on will be small. For example, M1 110 will turn on when the input voltage at $X_{in}$ is less than $V_{DD}-V_{THP}$ (a PMOSFET threshold below the positive power supply voltage). Since the oscillations start from this point, the oscillations grow asymmetrically such that the maximum amplitude is close to the positive supply voltage. This makes it difficult to measure the oscillation amplitude by measuring the difference between the minimum excursion and the direct current (DC) bias point of oscillation waveform.

The sample response shown in FIG. 2A was measured on a crystal oscillator using the Pierce oscillator amplifier circuit 100 shown in FIG. 1. The output current 210 peaks during the negative half of the cycle because $X_{in}$ voltage is at its maximum near $V_{DD}$. This output asymmetry provides enough distortion to activate unwanted third overtone modes of oscillation in crystals. FIG. 2B is graphical diagram 250 of an exemplary amplifier output current versus input voltage of a Pierce oscillator amplifier in accordance with the prior art, wherein M1 110 of FIG. 1 is a PMOS device. As shown in FIG. 2B, the output current is asymmetric with regard to the amplifier DC bias point.

The ratio between the minimum required gm (transconductance) to sustain oscillation at the smallest load capacitance and the maximum required gm to start oscillations at the largest load capacitance can be as much as 1:1000 for voltage controlled crystal oscillator (VCXO) applications. This range cannot be achieved by adjusting the bias current only, so amplifier non-linearities play a role in determining the effective negative resistance the amplifier applies to the crystal. During startup the amplitude of oscillation is small so that the gain of the amplifier is equal to the small signal gain of M1 110. As the amplitude of oscillation approaches its steady state value, the current limiting of M2 120 acts to reduce the large signal equivalent transconductance of the amplifier, which compensates the losses in the crystal resonator. At steady state, the large signal amplifier transconductance exactly compensates any loses in the crystal resonator (and its parasitic elements).

The amplifier nonlinear current limiting is part of the normal operation of the Pierce oscillator amplifier circuit, but Pierce oscillator amplifier circuit 100 of FIG. 1 has asymmetrical current limiting.

FIG. 2A shows that the amount of current that M1 110 can source is larger than the current M2 120 can sink over for a sinusoid input at $X_{in}$ centered about $V_{THP}$ of M1 110. At steady state, the amplifier must sink as much current as it sources. This means that M1 110 will be on just long enough to balance the current that flows through M2 120 while M1 110 is off. If M1 110 is on a fraction of the cycle, the minimum excursion at $X_{in}$ and $X_{out}$ will be very close to $V_{DD}-V_{THP}$ since this is the voltage at which M1 110 will turn on. At steady state, the large signal amplifier transconductance exactly compensates any loses in the crystal resonator (and its parasitic elements). This can present an unwanted constraint if the amplifier is used in an amplitude control loop.

SUMMARY OF THE INVENTION

Accordingly, a need exists for an oscillator amplifier circuit that eliminates asymmetric output current limiting. A need also exists for an oscillator amplifier circuit that satisfies the above need, and provides for easy measurement of the difference between the minimum excursion and the direct current (DC) bias point of oscillation waveform. A need also exists for an oscillator amplifier circuit that satisfies the above needs, and also avoids distortion that may activate unwanted third overtone modes of oscillation in crystals.

According to an embodiment, an amplifier circuit topology that provides symmetric limiting of output currents is described. The amplifier circuit includes a common source amplifier for sourcing a current and receiving an input, a current source load, and a current limiting device coupled between the common source amplifier and the current source load. The current limiting device is operable to limit the current sourced by the common source amplifier. A bias network coupled to the current limiting device biases the current limiting device. An output is coupled to the current limiting device. The amount of current that is sourced to the output of the amplifier circuit may be limited, such that current limiting is symmetrical.

In one embodiment, the amplifier circuit further includes a bias network coupled to the current limiting device for biasing the current limiting device. In one embodiment, the current limit bias is operable to control a ratio of the current of the common source amplifier and a sink current of the current source. In one embodiment, the ratio of the common source amplifier maximum source current to the current source maximum sink current is substantially 2:1. In another embodiment, the ratio is other than 2:1.

In one embodiment, the amplifier circuit further includes an amplifier bias circuit coupled to the current source load. In one embodiment, the amplifier bias circuit is coupled to an external amplitude control loop for adjusting an amplifier bias current of the amplifier bias circuit. In another embodiment, the current source is coupled to a constant bias amplifier.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION

Reference will now be made in detail to the various embodiments of the invention, examples of which are illustrated in the accompanying drawings. While the invention will be described in conjunction with the various embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Figure 1:
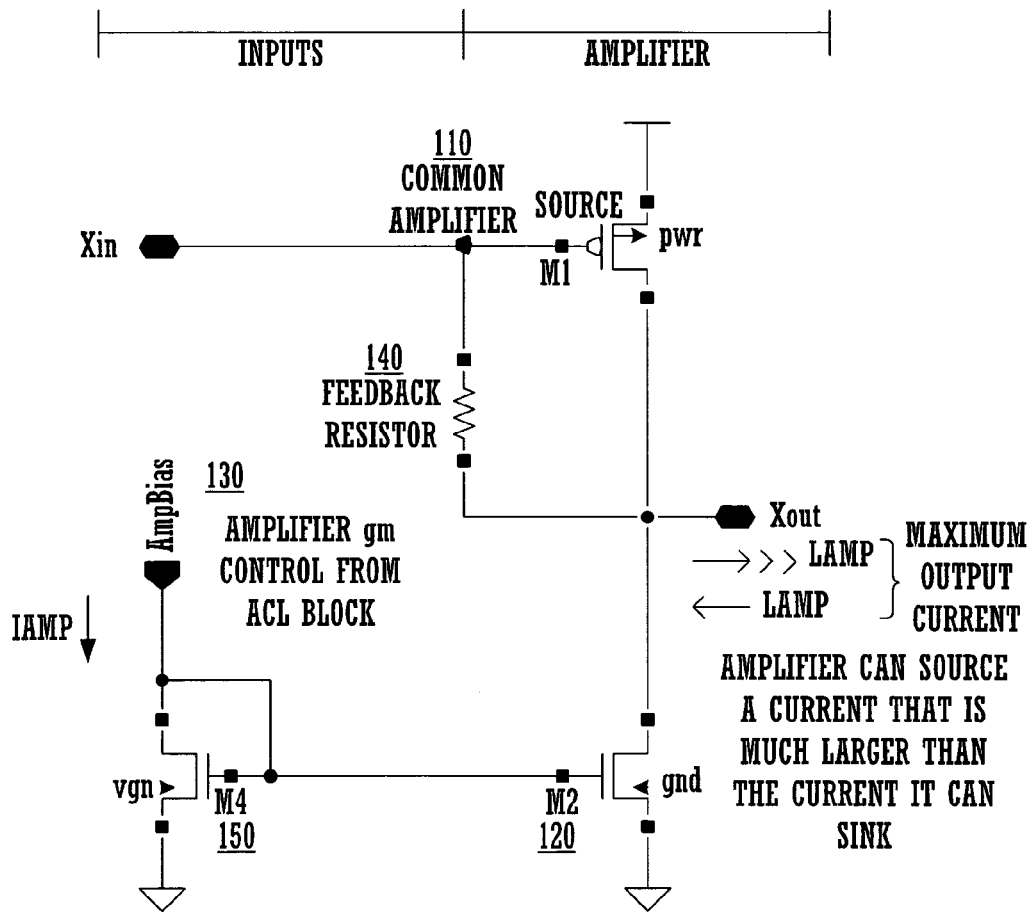
FIG. 1 is a circuit diagram of a conventional Pierce oscillator amplifier circuit, in accordance with the prior art.
Figure 2A:
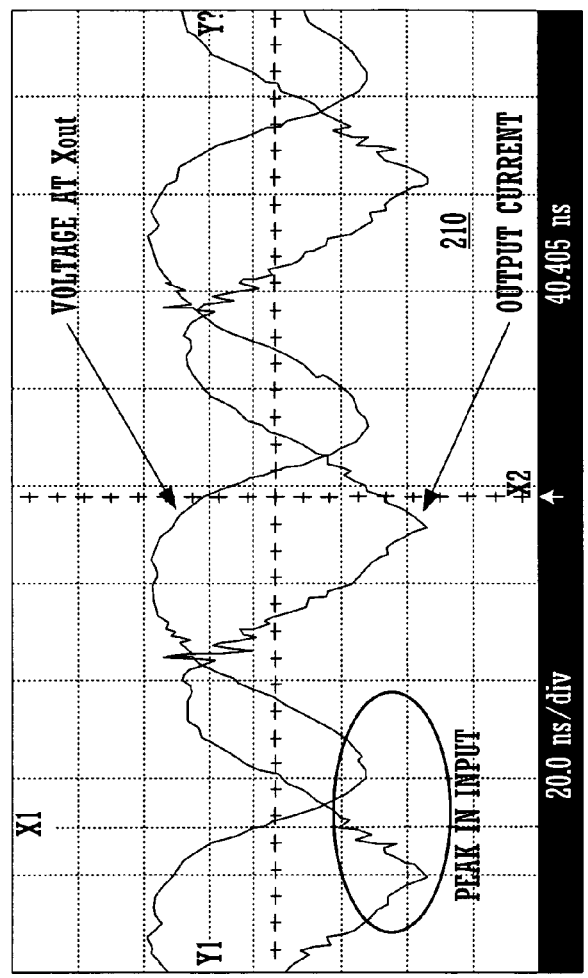
FIG. 2A is graphical diagram of an exemplary waveform from a conventional Pierce oscillator amplifier circuit with asymmetrical output current, in accordance with the conventional art.
Figure 2B:
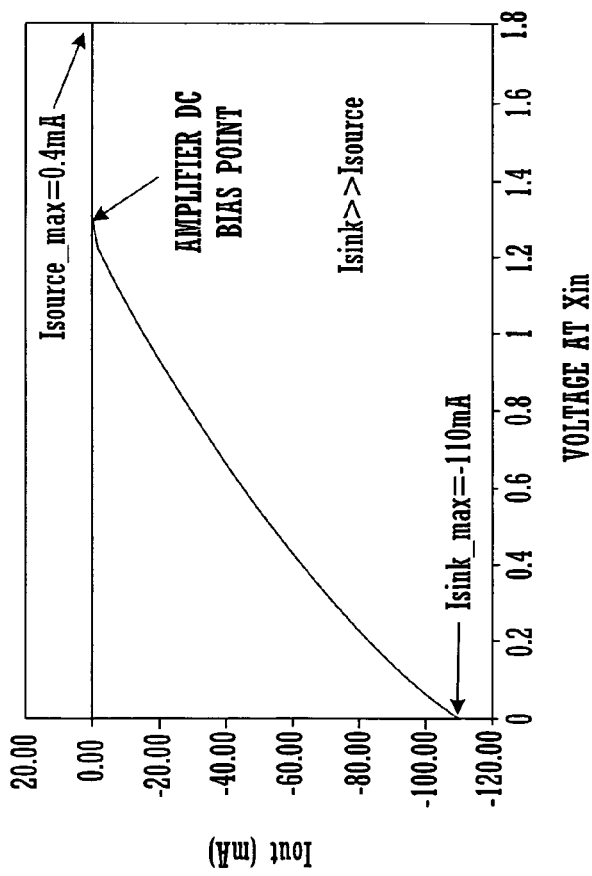
FIG. 2B is graphical diagram of an exemplary amplifier output current versus input voltage of a Pierce oscillator amplifier in accordance with the prior art.
Figure 3:
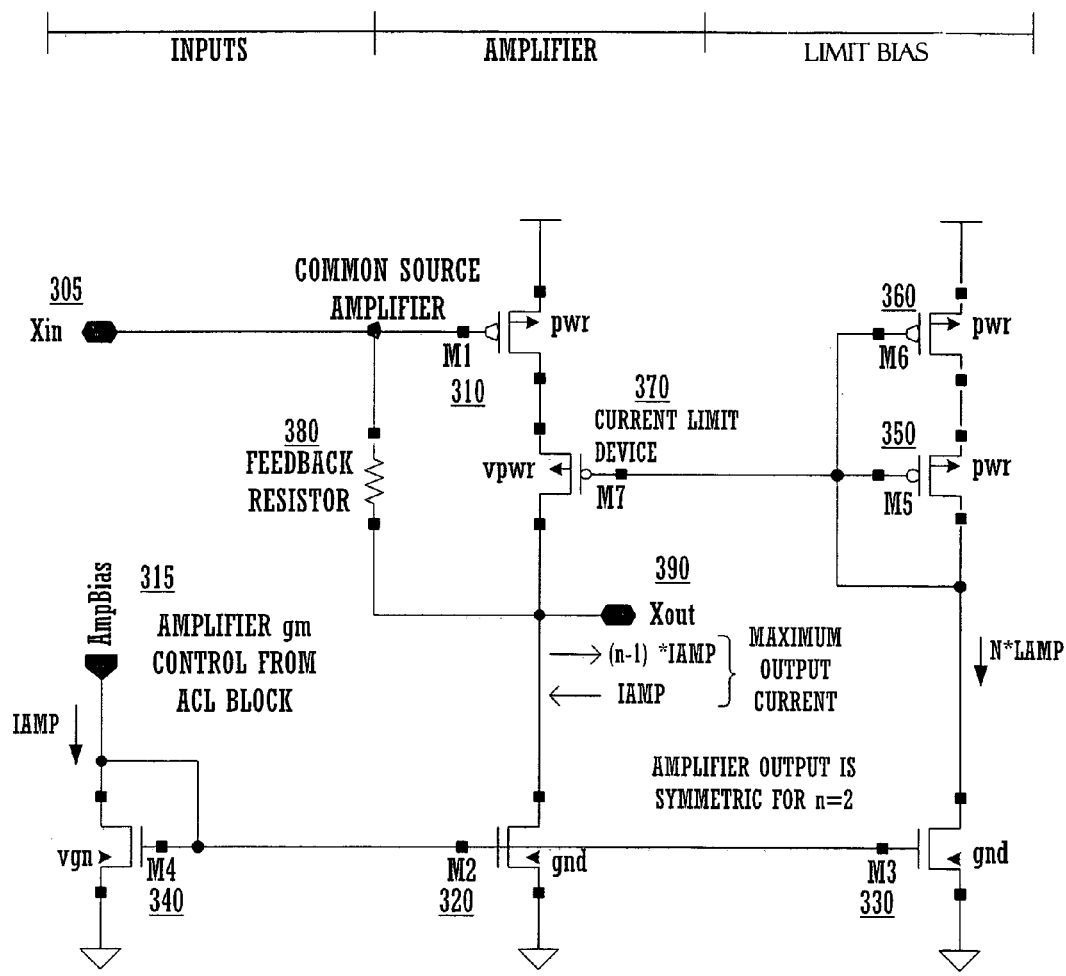
FIG. 3 is a circuit diagram of an amplifier circuit, in accordance with an embodiment of the present invention.

FIG. 3 is a circuit diagram of an amplifier circuit 300, in accordance with an embodiment of the present invention. In one embodiment, the present invention provides an improved Pierce amplifier with symmetric output current. The amplifier circuit 300 shown in FIG. 3 eliminates the asymmetric output current limiting of the conventional solution.

Amplifier circuit 300 includes a common source amplifier (M1) 310 with a current mirror load (M2) 320. Common source amplifier 310 is operable to source a current and receive an input voltage $X_{in}$ 305. Current mirror load 320 is coupled to current mirror M4 340. The combination of M2 320 and M4 340 is referred to herein as a current source or a complementary current source. The common source amplifier 310 can operate in either weak or strong inversion. An external amplitude control loop can be used to adjust the current into the amplifier bias (AmpBias) node 315 coupled to M4 340 to control the transconductance (gm) of M1 310, which will control the oscillation amplitude. The feedback resistor 380 is used to bias common source amplifier 310.

FIG. 3 also includes a current limit device M7 370 and devices used to bias M7 370 (devices M3 330, M5 350, and M6 360). Together, M1 310 and M7 370 form a composite common source/common gate amplifier. The bias voltage at the gate of M7 370 controls the amount of current that can flow between the source and drain of M7 370. M7 370 acts as a current limit device where the maximum current is controlled by the bias network consisting of M3 330, M5 350, and M6 360.

M6 360 biases the M5 350 source at approximately the same DC value as M7 370. M5 350 is a diode connected MOSFET that provides the appropriate gate to source voltage at M7 370 to limit the current through M7 370. M3 330, M5 350, and M7 370 bias this device. For the example shown in FIG. 3, device M7 370 is biased to limit the current from its source to drain to a ratio of the current flowing through M5 350. If the current flowing through M5 350 limits the current through M7 370 to an integer n multiplied by the bias current $I_{amp}$, the maximum current the amplifier can source will be the current through both M1 310 and M7 370 minus the current through M2 320 or $(n-1)I_{amp}$, where n is the current mirror multiplication of Iamp to the amplifier limiter, which is determined by the W/L ration of M3 330 to M4 340. In one embodiment, the amplifier output current will be symmetric if n=2. It should be appreciated that amplifier circuit 300 may produce an asymmetrical output (e.g., n≠2). The amplifier output current is output at $X_{out}$ 390.

One advantage of using the current limit device M7 370 is that the current limiting action of M2 320 can be matched by the current limiting action of M7 370. It should be appreciated that the bias currents are not constrained to the values shown in FIG. 3. The maximum current the improved amplifier topology can sink is given by Equation 1, but the maximum current the amplifier can source (neglecting second order effects) is shown in Equation 3.

$$I_{sink_{MAX}} = -\frac{(W/L)_{M2}}{(W/L)_{M4}} I_{amp} \quad (1)$$

$$I_{source_{MAX}} \left( \frac{(W/L)_{M3}}{(W/L)_{M4}} \frac{(W/L)_{M7}}{(W/L)_{M5}} - \frac{(W/L)_{M2}}{(W/L)_{M4}} \right) I_{amp} \quad (3)$$

To provide enough head room for the circuit to operate properly at low voltage, it may be necessary for the value given by Equation 3 to be greater than the value Equation 1. This will be defined as the ratio shown in Equation 4.

$$M = \frac{I_{source_{MAX}}}{I_{sink_{MAX}}} \quad (4)$$

The current limit device M7 370 and its related bias network are used to limit the current the amplifier can source to create a more symmetric output current. This allows the (W/L)M1 ratio to be optimized to provide the required amount of gm (transconductance). The current limit device and its bias network are sized to force the required amount of symmetry between the positive and negative half cycles of the output without decreasing the small signal gm (transconductance) at the DC bias voltage of M1 310.

In one embodiment, the ratio of the amplifier circuit's maximum source current to maximum sink current is substantially 2:1. In another embodiment, the ratio is other than 2:1. It should be appreciated that the common source amplifier sources two times the sink current, such that the ratio is 2:1. In other words, M7 370 is operable to limit the amount of current M1 310 can source to two times the current M2 320 can sink. Therefore, the output current amplifier circuit 300 will source at $X_{out}$ will be equal to the amount of current M2 320 can sink. This is because M2 320 sinks a constant amount of current.

Figure 4A:
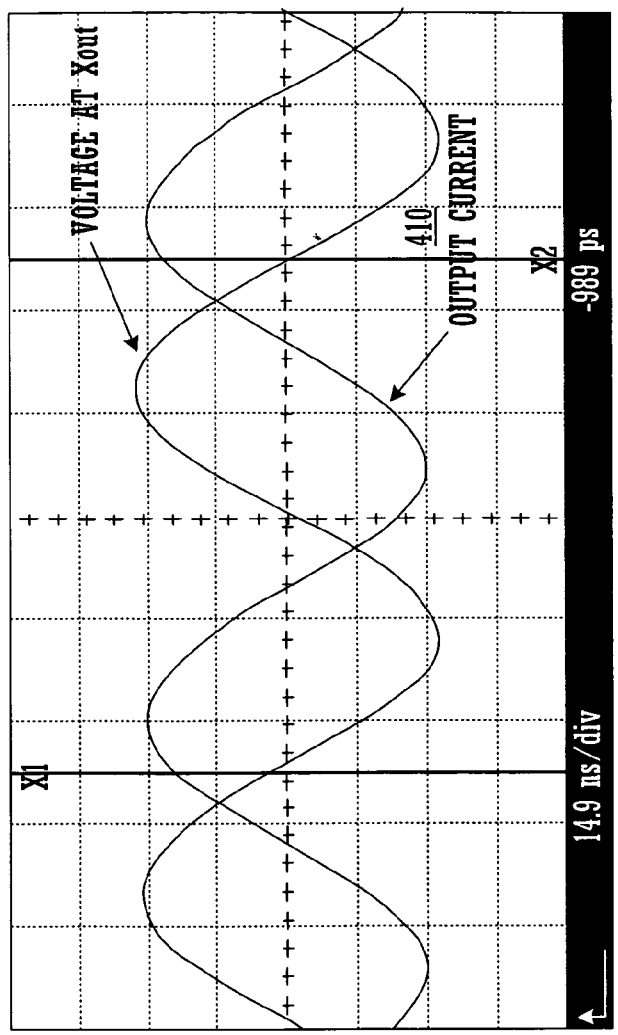
FIG. 4A is graphical diagram of an exemplary waveform from an amplifier circuit with symmetrical output current, in accordance with an embodiment of the present invention.
Figure 4B:
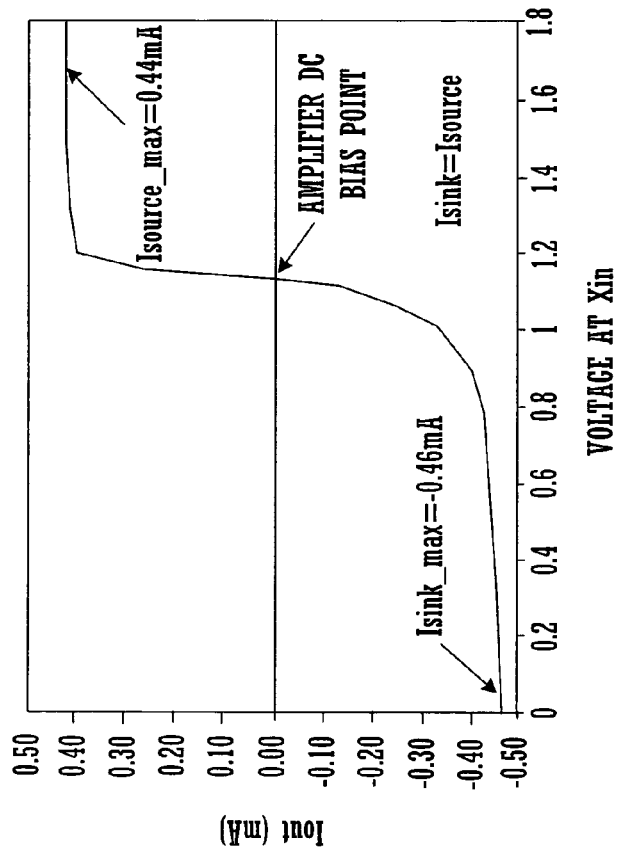
FIG. 4B is graphical diagram of an exemplary amplifier output current versus input voltage of an amplifier circuit in accordance with an embodiment of the present invention.

FIG. 4A is graphical diagram of an exemplary waveform 400 from an amplifier circuit with symmetrical output current, in accordance with an embodiment of the present invention. Exemplary waveform 400 includes a symmetrical output current 410 utilizing an M ratio of M=3. However, it should be appreciated that any M ratio may be used. Moreover, it should be appreciated that amplifier circuit 300 may produce an asymmetrical output (e.g., n≠2). FIG. 4B is graphical diagram 450 of an exemplary amplifier output current $I_{out}$ versus input voltage $X_{in}$ of an amplifier circuit in accordance with an embodiment of the present invention. In the example shown in FIG. 4B, M1 310 of FIG. 3 is a PMOS device. As shown in FIG. 4B, the output current is symmetric with regard to the amplifier DC bias point. It should be appreciated that diagram 450 is exemplary, and that other values of output current and input voltage may be generated.

In one embodiment, the current oscillator forces the output to be symmetric so that M1 310 is on approximately half of the cycle. Since the oscillation grows symmetrically about this point, the oscillation amplitude can be controlled by detecting the minimum excursion of the oscillation waveform between the DC bias point and ground.

Figure 5:
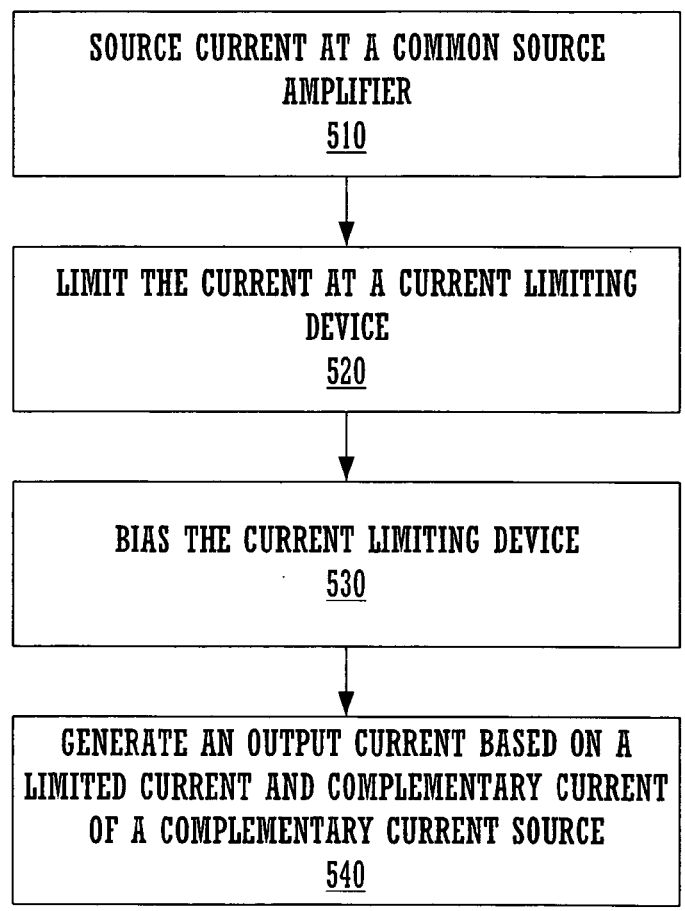
FIG. 5 is a flowchart of a process for current limiting in an oscillator amplifier circuit, in accordance with one embodiment of the present invention.

FIG. 5 illustrates a flowchart of a process 500 for current limiting in an oscillator amplifier circuit, in accordance with one embodiment of the present invention. In one embodiment, process 500 is performed on by an amplifier circuit (e.g., amplifier circuit 300 of FIG. 3). Although specific steps are disclosed in process 500, such steps are exemplary. That is, the embodiments of the present invention are well suited to performing various other steps or variations of the steps recited in FIG. 5.

At step 510 of process 500, a current is sourced at a common source amplifier (e.g., common source amplifier M1 310 of FIG. 3). At step 520, the current is limited at a current limiting device (e.g., current limiting device M7 370 of FIG. 3). At step 530, the current limiting device is biased. In one embodiment, the current limiting device is biased according to a bias network (e.g., devices M3 330, M5 350, and M6 360 of FIG. 3). At step 540, an output current is output based on a limited current and complementary current of a complementary current source (e.g., devices M2 320 and M4 340). In one embodiment, the output current is symmetrical.

Advantages of the improved circuit over the conventional solution include that in the improved oscillator amplifier topology the output current symmetry is decoupled from the amplifier gm. Moreover, the symmetric output current limiting reduces distortion, and the symmetric output current limiting allows symmetric oscillation amplitude to be measured on either side of the oscillation DC bias point. Reduction of distortion reduces the probability of exciting unwanted overtone modes in the resonator. Symmetric oscillation amplitude controlled by an external loop enables better control of oscillation amplitude in order to reduce the power delivered to the crystal, this reducing the aging of the crystal resonator.

In another embodiment, the current limit transistor can be used with other single-ended and differential amplifier topologies to create a symmetric output current. The bias network can be built without M6 360. Moreover, M6 360 can be diode connected. In another embodiment, a complementary version of the circuit can be created by interchanging PMOS and NMOS devices. The current limit device and its bias network can be implemented using bipolar devices.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention, an analog spread spectrum signal generation circuit, are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention. While the present invention has been described in particular embodiments, it should be appreciated that the present invention should not be construed as limited by such embodiments, but rather construed according to the below claims.

What is claimed is:

1. An amplifier circuit comprising:
   a common source amplifier for sourcing a current and receiving a voltage input;
   a current source;
   a current limiting device coupled between said common source amplifier and said current source, said current limiting device is operable to limit said current sourced by said common source amplifier;
   a bias network coupled to said current limiting device for biasing said current limiting device; and
   an output coupled to said current limiting device.

2. The amplifier circuit of claim 1 further comprising a feedback resistor coupled to said common source amplifier for biasing said common source amplifier.

3. The amplifier circuit of claim 1 wherein a current limit bias is operable to control a ratio of said current of said common source amplifier and a sink current of said current source.

4. The amplifier circuit of claim 3 wherein said ratio is substantially 2:1.

5. The amplifier circuit of claim 3 wherein said ratio is other than 2:1.

6. The amplifier circuit of claim 1 further comprising an amplifier bias circuit coupled to said current source.

7. The amplifier circuit of claim 6 wherein said amplifier bias circuit is coupled to an external amplitude control loop for adjusting an amplifier bias current of said amplifier bias circuit.

8. The amplifier circuit of claim 6 wherein said current source is coupled to a constant bias amplifier.

9. The amplifier circuit of claim 1 wherein said current limiting device is operable to limit an amount of said current that is sourced to said output of said amplifier circuit, such that current limiting is symmetrical.

10. The amplifier circuit of claim 3 wherein said current limiting device is operable to limit an amount of said current that is sourced to said output of said amplifier circuit according to said ratio, such that current limiting is asymmetrical.

11. An amplifier circuit, comprising:
    a composite amplifier having a common source and common gate, said composite amplifier receiving an input voltage at said common source;
    a complementary current source;
    a bias network coupled between said common gate of said composite amplifier and said complementary current source, wherein said bias network operates as a current limiting device; and
    a feedback resistor coupled to said common source for biasing said composite amplifier, wherein said composite amplifier provides an output.

12. The amplifier circuit of claim 11 wherein a current limit bias is operable to control a ratio between a maximum current through said composite amplifier and said complementary current source.

13. The amplifier circuit of claim 12 further comprising an amplifier bias circuit coupled to said complementary current source, and wherein said ratio is substantially a multiple of an amplifier bias current of said amplifier bias circuit.

14. The amplifier circuit of claim 13 wherein said amplifier bias current is substantially equal to a current through said complementary current source.

15. The amplifier circuit of claim 12 wherein said ratio is substantially 2:1.

16. The amplifier circuit of claim 12 wherein said ratio is other than 2:1.

17. The amplifier circuit of claim 13 wherein said amplifier bias circuit is coupled to an external amplitude control loop for adjusting said amplifier bias current.

18. The amplifier circuit of claim 13 wherein said complementary current source is coupled to a constant bias amplifier.

19. The amplifier circuit of claim 11 wherein said bias network is operable to limit the amount of current that is sourced to said output of said amplifier circuit, such that current limiting is symmetrical.

20. The amplifier circuit of claim 12 wherein said bias network is operable to limit an amount of current that is sourced to said output of said amplifier circuit according to said ratio, such that current limiting is asymmetrical.

21. In an amplifier circuit, a method for current limiting, said method comprising:
    sourcing current at a common source amplifier;
    limiting said current at a current limiting device;
    biasing said current limiting device; and
    generating an output current based on a limited current and complementary current of a complementary current source.

22. The method as recited in claim 21 wherein said output current is symmetrical.

23. The method as recited in claim 22 further comprising adjusting a ratio between a maximum current through said common source amplifier and said complementary current source.

24. The method as recited in claim 23 wherein said output current is asymmetrical.

* * * * *